United States Patent
Song et al.

(10) Patent No.: US 9,281,934 B2
(45) Date of Patent: Mar. 8, 2016

(54) CLOCK AND DATA RECOVERY WITH HIGH JITTER TOLERANCE AND FAST PHASE LOCKING

(71) Applicant: QUALCOMM Incorporated, San Diego, CA (US)

(72) Inventors: Yu Song, San Diego, CA (US); Jan Christian Diffenderfer, Escondido, CA (US); Nan Chen, San Diego, CA (US); David Ian West, San Diego, CA (US); Paul Lawrence Viani, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/268,850

(22) Filed: May 2, 2014

(65) Prior Publication Data

US 2015/0318978 A1 Nov. 5, 2015

(51) Int. Cl.
| | |
|---|---|
| *H04L 7/00* | (2006.01) |
| *H04L 25/00* | (2006.01) |
| *H04L 25/40* | (2006.01) |
| *H03L 7/091* | (2006.01) |
| *H03L 7/08* | (2006.01) |
| *H04L 7/033* | (2006.01) |

(52) U.S. Cl.
CPC ............ *H04L 7/0016* (2013.01); *H03L 7/0807* (2013.01); *H03L 7/091* (2013.01); *H04L 7/0338* (2013.01)

(58) Field of Classification Search
CPC ...... H04L 7/027; H04L 7/0337; H04L 7/0338; H04L 7/091; H04L 7/0807
USPC .......................................... 375/354, 355, 371
See application file for complete search history.

(56) References Cited

U.S. PATENT DOCUMENTS

| | | | |
|---|---|---|---|
| 4,972,443 A * | 11/1990 | Sarkoezi | ........................ 375/360 |
| 6,545,507 B1 | 4/2003 | Goller | |
| 6,584,163 B1 | 6/2003 | Myers, Jr. et al. | |
| 6,738,922 B1 | 5/2004 | Warwar et al. | |
| 7,099,424 B1 | 8/2006 | Chang et al. | |
| 8,238,501 B2 | 8/2012 | Yang et al. | |
| 2002/0085657 A1* | 7/2002 | Boerstler | ........................ 375/373 |
| 2007/0009066 A1* | 1/2007 | Fredriksson | .................. 375/326 |
| 2011/0175758 A1 | 7/2011 | Iqbal et al. | |
| 2014/0139266 A1* | 5/2014 | Kenney et al. | ..................... 327/9 |

FOREIGN PATENT DOCUMENTS

| | | |
|---|---|---|
| EP | 0822683 A2 | 2/1998 |
| EP | 1172962 A2 | 1/2002 |

OTHER PUBLICATIONS

International Search Report and Written Opinion—PCT/US2015/020997—ISA/EPO—Jun. 23, 2015.

* cited by examiner

*Primary Examiner* — Freshteh N Aghdam
(74) *Attorney, Agent, or Firm* — Procopio, Cory, Hargreaves & Savitch LLP (57) ABSTRACT

Systems and methods for recovering clock and data from a data input signal are disclosed that sample a plurality of clock phase signals with the data input signal to determine a timing relationship between the data input signal and the clock phase signals and use the determined to timing relationship to select one of the clock phase signals to use for sampling the data input signal to produce recovered data. The CDR can include a glitch suppression module to suppress glitches on the clock output signal that could be caused by large instantaneous jitter on the data input signal. A clock and data recovery circuit (CDR) using these methods can quickly lock to a new data input signal and can reliably receive data when there is large instantaneous timing jitter on the data input signal.

26 Claims, 9 Drawing Sheets

CLOCK AND DATA RECOVERY WITH HIGH JITTER TOLERANCE AND FAST PHASE LOCKING

BACKGROUND

1. Field

The present invention relates to electronic circuits and, more particularly, to a clock and data recovery circuit with high jitter tolerance and fast phase locking

2. Background

The use of high-speed serial communication links in electronic systems continues to increase. High-speed serial communication links can operate according to various standards such as Universal Serial Bus (USB), High-Definition Multimedia Interface (HDMI), Serial Advanced Technology Attachment (SATA), and Peripheral Component Interconnect Express (PCIe) interfaces. A clock and data recovery circuit (CDR) is used to recover data from a serial communication link and recover a clock that signals the timing of the data.

In some systems, for example, USB, the serial data can have large instantaneous timing jitter. Prior CDRs can produce errors (e.g., the recovered data is incorrect) in some jitter conditions. Prior CDRs can also exhibit slow initial locking to the input data. Some prior CDRs have included complex circuitry in an attempt to handle the timing jitter.

SUMMARY

In one aspect, a circuit is provided for recovering clock and data from a serial data input signal using clock phase signals, the data input signal containing a serial stream of data, the clock phase signals oscillating at a frequency that approximately matches a data rate of the data input signal, and the clock phase signals equally spaced in phase. The circuit includes: a phase sampler module configured to sample values of clock phase signals on edges of a data input signal; a phase adjust module configured to evaluate the sampled values of the clock phase signals to determine a timing relationship between the data input signal and the clock phase signals; a phase select module configured to produce a clock output signal using the clock phase signals based on the timing relationship between the data input signal and the clock phase signals determined by the phase adjust module; and a data sampler configured to produce a data output signal by sampling the data input signal on edges of the clock output signal In one aspect, a method for recovering clock and data from a data input signal is provided. The method includes: sampling values of clock phase signals on edges of the data input signal; evaluating the sampled values of the clock phase signals to determine a timing relationship between the data input signal and the clock phase signals; producing a clock output signal using the clock phase signals based on the determined timing relationship between the data input signal and the clock phase signals; and sampling the data input signal on edges of the clock output signal to produce a data output signal.

In one aspect, an apparatus is provided for recovering clock and data from a data input signal. The apparatus includes: a means for sampling values of clock phase signals on edges of the data input signal; a means for evaluating the sampled values of the clock phase signals to determine a timing relationship between the data input signal and the clock phase signals; a means for producing a clock output signal using the clock phase signals based on the determined timing relationship between the data input signal and the clock phase signals; and a means for sampling the data input signal on edges of the clock output signal to produce a data output signal.

Other features and advantages of the present invention should be apparent from the following description which illustrates, by way of example, aspects of the invention.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

Figure 1:
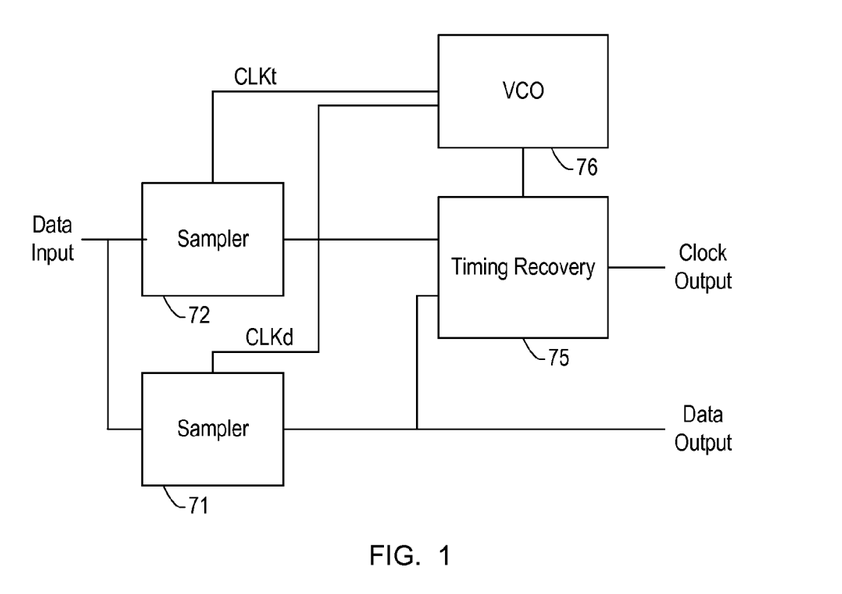
FIG. 1 is a functional block diagram of a clock and data recovery circuit.

FIG. 1 is a functional block diagram of a clock and data recovery circuit (CDR). The CDR receives a data input signal (Data Input). The data input signal contains a serial stream of data. Each bit of the serial stream of data spans a time interval that may be referred to as a bit time. The CDR operates to recover the data from the input to produce a data output signal (Data Output) and produce a clock output signal (Clock Output) that indicates the timing of the data.

The CDR includes a first sampler 71 and a second sampler 72. The first sampler 71 supplies the data output from the CDR. The outputs from the first sampler 71 and the second sampler 72 are used to recover timing from the data input signal. The first sampler 71 samples the data input signal on rising edges of a data clock signal CLKd and produces an output that indicates the sampled value. The second sampler 72 samples the data input signal on rising edges of a timing clock signal CLKt and produces an output that indicates the sampled value. The timing clock signal CLKt is the complement of the data clock signal CLKd so that the sampling times of the first sampler 71 and the second sampler 72 are offset by one-half of a clock period. The data input signal and other signals of the CDR may be differential signals.

A timing recovery module 75 receives the output of the first sampler 71 and the output of the second sampler 72, which are sampled at different clock phases. The timing recovery module 75 uses the outputs of the samplers, for example, based on an Alexander phase detector, to control the frequency of a voltage controlled oscillator (VCO) 76. The VCO 76 supplies the data clock signal CLKd and the timing clock signal CLKt based on the control from the timing recovery module 75. The timing recovery module 75 controls the VCO 76 to adjust the timing of the clock signals so that the data clock signal CLKd is near the center of the bit times. The CDR of FIG. 1 may produce errors (e.g., the recovered data is incorrect) in some jitter conditions. Additionally, the CDR of FIG. 1 may exhibit slow initial locking to the input data.

Figure 2:
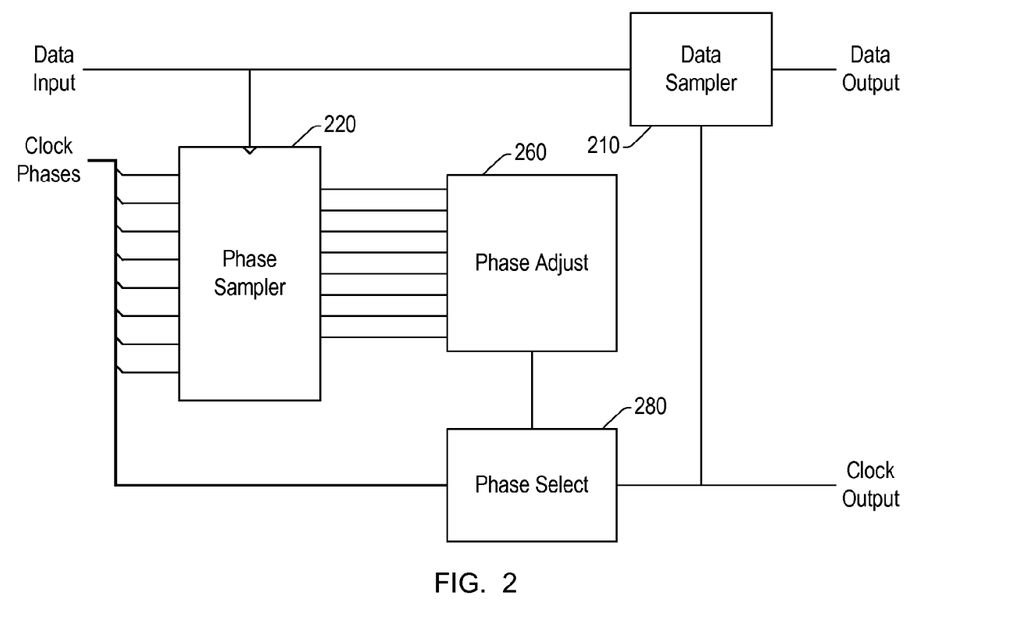
FIG. 2 is a functional block diagram of a clock and data recovery circuit according to a presently disclosed embodiment.

FIG. 2 is a functional block diagram of a clock and data recovery circuit (CDR) according to a presently disclosed embodiment. The CDR can provide high jitter tolerance and fast phase locking.

The CDR receives a data input signal (Data Input) that conveys a serial stream of data. Each bit of data in the serial stream spans a time duration referred to as a bit time. The duration of each bit time is nominally the inverse of the data rate. However, the time duration of an individual bit time can vary, for example, due to timing jitter. The CDR produces a data output signal (Data Output) that signals data recovered from the data input signal and a clock output signal (Clock Output) that signals the timing of the Data output signal.

The CDR receives a plurality of clock phase signals (Clock Phases). The clock phase signals oscillate at the same frequency but are separated in phase. For example, there may be eight clock phase signals that are spaced by one-eighth of the clock period. In many embodiments, there are an even number of clock phase signals with pairs of the clock phase signals being complementary. The clock phase signals may, for example, be supplied by a phase-locked loop (PLL). Although the clock phase signals may be considered to be equally spaced in phase, there may be variations in the relative phases, for example, due to mismatches in a circuit that produces the clock phase signals.

The frequency of the clock phase signals corresponds to the data rate of the data input signal. The clock frequency may be locked to the data rate or may be from an independent source that approximately matches the data rate of the data input signal. For example, the clock phase signals may be generated from a reference oscillator whose frequency nominally matches the data rate. The CDR can recover the data and clock even when the frequency of the clock phase signals and the data rate of the data input signal differ by a large amount (e.g., 1%).

The CDR includes a phase sampler module 220 that samples the values of the clock phase signals on transitions of the data input signal. This is in contrast to the more common situation, as illustrated in FIG. 1, of sampling a data signal on transitions of a clock signal. The values of the clock phase signals may be sampled on rising edges, falling edges, or both rising and falling edges of the data input signal. Signal edges may also be referred to as transitions; for example, a rising edge may also be referred to as a rising transition or a transition from a low level to a high level. The phase sampler module 220 may include, for example, a phase sampler for each of the clock phase signals. Alternatively, the phase sampler module 220 may include a phase sampler for pairs of complementary clock phase signals. The sampled values of the clock phase signals are supplied to a phase adjust module 260.

The phase adjust module 260 evaluates the sampled values of the clock phase signals to determine a timing relationship between the data input signal and the clock phase signals. The phase adjust module 260 signals the timing relationship to a phase select module 280 for use in producing the clock output signal.

The phase select module 280 produces the clock output signal using the clock phase signals based on the timing relationship between the data input signal and the clock phase signals. The timing relationship between the data input signal and the clock phase signals may be viewed as where in the clock period the data input signal transitions.

The phase select module 280 may produce the clock phase signals by selecting among the clock phase signals based on a control received from the phase adjust module 260 that indicates the timing relationship between the data input signal and the clock phase signals. Alternatively, the phase select module 280 may produce the clock output signal using one of the clock phase signals to time rising transitions of the clock output signal and another one of the clock phase signals to time falling transitions of the clock output signal. Alternatively, the phase select module 280 may produce the clock output signal by forming a logical combination of the clock phase signals. The clock output signal may have a duty cycle that is different from the duty cycle of the clock phase signals.

A data sampler module 210 samples the data input signal on rising edges of the clock output signal to produce the data output signal. Other edges of the clock output signal may also be used. The edge of the clock output signal that triggers the data sampler module 210 may be referred to as the leading edge. The data sampler module 210 may use, for example, a sense amplifier based flip-flop to sample the data input signal.

The phase adjust module 260 may, for example, control the timing of the clock output signal so that the data sampler module 210 samples the data input signal near midpoints of the bit times. The phase adjust module 260 can, for example, determine where in the clock period the data input signal transitions and select a clock phase that is one-half of a clock period later. The phase adjust module 260 may alternatively use other offsets between when in the clock period the data input signal transitions and the timing of the clock output signal. For example, a greater offset may provide improved performance when the data input signal passes through an R-C filter (e.g., due to signal routing).

The sampled values of the clock phase signals will include a sequence of ONEs and a sequence of ZEROS. For example, when the CDR uses eight phases and the clock phase signals are sampled between the rise of the first and second clock phase signals, the sampled values will be ONE, ZERO, ZERO, ZERO, ZERO, ONE, ONE, ONE corresponding to the first through eighth clock phase signals. The phase adjust module 260 may locate the consecutive ONE-ZERO or ZERO-ONE values in the sampled values of the clock phase signals to determine the timing relationship between the data input signal and the clock phase signals.

The phase adjust module 260 may determine where in the clock period the data input signal transitions by evaluating the sampled values of the clock phase signals to determine the last of the clock phase signals to rise before a respective edge of the data input signal. The phase select module 280 can then generate the clock output signal so that its leading edge (which triggers the data sampler module 210) is offset from the last of the clock phase signals to rise before the respective edge of the data input signal. The offset of the leading edge of the clock output signal from the last of the clock phase signals to rise before the edge of the data input signal may be, for example, one-half of a clock period. Using an offset of one-half of a clock period causes the data sampler module 210 to sample the data input signal near the middle of the bit time, since one-half of a clock period equals or approximately equals one-half of a bit time and the last of the clock phase signals to rise before the edge of the data input signal is near the edge of the bit time. Other offsets may also be used, for example, based on waveform characteristics of the data input signal. Similarly, the phase adjust module 260 may determine where in the clock period the data input signal transitions by evaluating the sampled values of the clock phase signals to determine the last of the clock phase signals to fall before a respective edge of the data input signal with the phase select module 280 generating the clock output signal so that its leading edge is offset (by a different amount than when using the last of the clock phase signals to rise before the edge of the data input signal) from the last of the clock phase signals to fall before the edge of the data input signal.

The CDR of FIG. 2 can recover phase from a Data Input signal nearly instantaneously. For example, the values of the clock phase signals sampled by an edge of the data input signal may be used to produce the clock output signal within the same clock period or within a few clock periods. The ability of the CDR to quickly change the timing of the clock output signal allows the CDR to quickly lock to a new data input signal and allows the CDR to reliably receive data when there is large instantaneous timing jitter on the data input signal.

The modules of the CDR of FIG. 2 can be implemented in many different ways. In an embodiment, the CDR is implemented in a complementary metal oxide semiconductor (CMOS) integrated circuit. Additionally, some of the modules for example, the phase adjust module 260 and the phase select module 280, may be combined.

Figure 3:
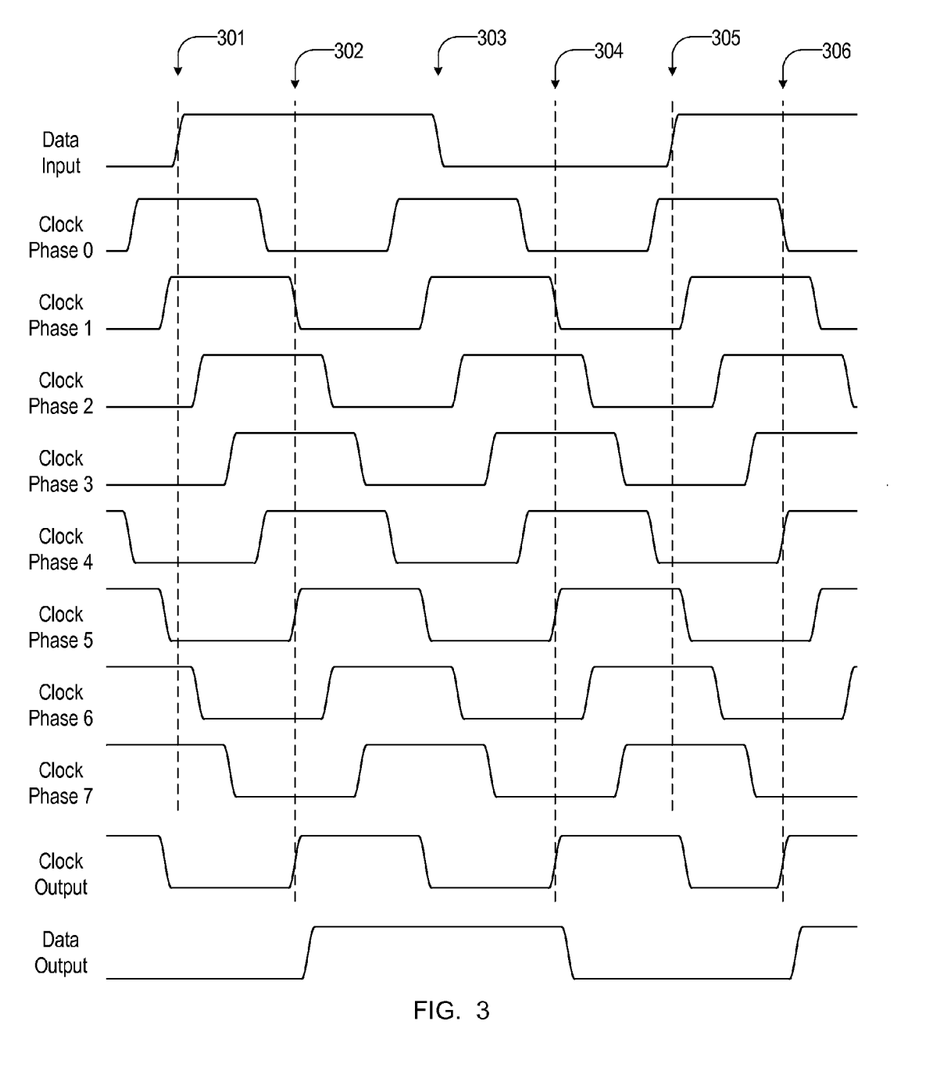
FIG. 3 is a waveform diagram illustrating operation of the clock and data recovery circuit of FIG. 2.

FIG. 3 is a waveform diagram illustrating operation of the CDR of FIG. 2. The example waveforms are for a CDR with eight clock phases. Thus, the clock phase signals (Clock Phase 0-7) are sequentially offset in phase by one-eighth of a clock period. The clock period, by naming convention, begins with the rising edge of the first clock phase signal (Clock Phase 0). For clarity of illustration, the waveforms are illustrated for circuit delays that are small relative to the clock period; however, the CDR of FIG. 2 is not so limited.

At time 301, the data input signal rises and the clock phase signals are sampled in the phase sampler module 220. The phase sampler module 220 will determine that, at time 301, Clock Phases 0, 1, 6, and 7 were high and that Clock Phases 2, 3, 4, and 5 were low. The phase adjust module 260 can evaluate the sampled values of the clock phase signals and determine that the edge of the data input signal occurred between the rising edge of Clock Phase 1 and the rising edge of Clock Phase 2 (e.g., based on Clock Phase 1 being high and Clock Phase 2 being low). Based on this, the phase adjust module 260 in combination with the phase select module 280 can select phase 5 to produce the clock output signal. Accordingly, at time 302, the clock output signal rises (based on Clock Phase 5) and the data sampler module 210 samples the data input signal on the rising edge of the clock output signal. At time 302, the data input signal is high and thus the CDR produces the data output signal as a high.

At time 303, the data input signal falls. In the example waveforms, the phase sampler module 220 is not triggered by the falling edge of the data input signal. Thus, the phase adjust module 260 does not produce a new phase selection and the previously selected phase is used again. Accordingly, at time 304, the clock output signal rises (based on Clock Phase 5) and the data input signal is again sampled by the data sampler module 210. At time 304, the data input signal is low and thus the CDR produces the data output signal as a low.

At time 305, the data input signal rises and the clock phase signals are sampled in the phase sampler module 220. The phase sampler module 220 will determine that, at time 305, Clock Phases 0, 5, 6, and 7 were high and that Clock Phases 1, 2, 3, and 4 were low. The phase adjust module 260 can evaluate the sampled values of the clock phase signals and determine that the edge of the data input signal occurred between the rising edge of Clock Phase 0 and the rising edge of Clock Phase 1. From time 301 to time 305, the timing of the data input signal has advanced relative to the clock phase signals. The relative timing of the data input signal and the clock phase signals may have changed, for example, due to timing jitter or a frequency difference between the clock phase signals and the data rate of the data input signal. Based on the new sampled values of the clock phase signals, the phase adjust module 260 in combination with the phase select module 280 can select phase 4 to produce the clock output signal. Accordingly, at time 306, the clock output signal rises (based on Clock Phase 4) and the data sampler module 210 samples the data input signal on the rising edge of the clock output signal. At time 306, the data input signal is high and thus the CDR produces the data output signal as a high.

At each subsequent rising edge of the data input signal, the CDR operates in a like manner.

Figure 4:
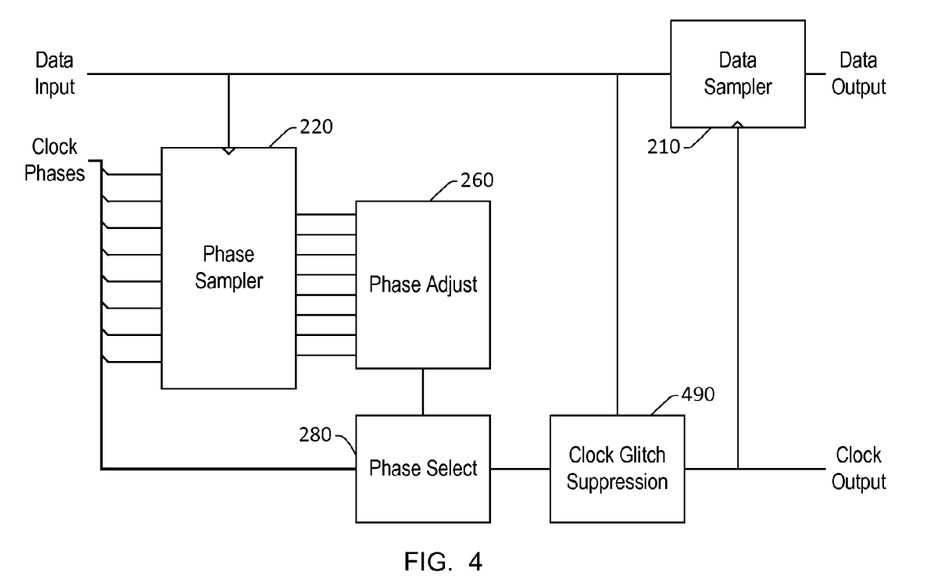
FIG. 4 is a functional block diagram of another clock and data recovery circuit according to a presently disclosed embodiment.

FIG. 4 is a functional block diagram of another clock and data recovery circuit (CDR) according to a presently disclosed embodiment. The CDR of FIG. 4 is similar to the CDR of FIG. 2 with like referenced elements operating in like fashion except for described differences. The CDR of FIG. 4 includes a clock glitch suppression module 490. The clock glitch suppression module 490 operates to prevent glitches (e.g., pulses shorter than an expected duration) in the clock output signal that could otherwise be caused by large timing jitter on the data input signal.

Figure 5:
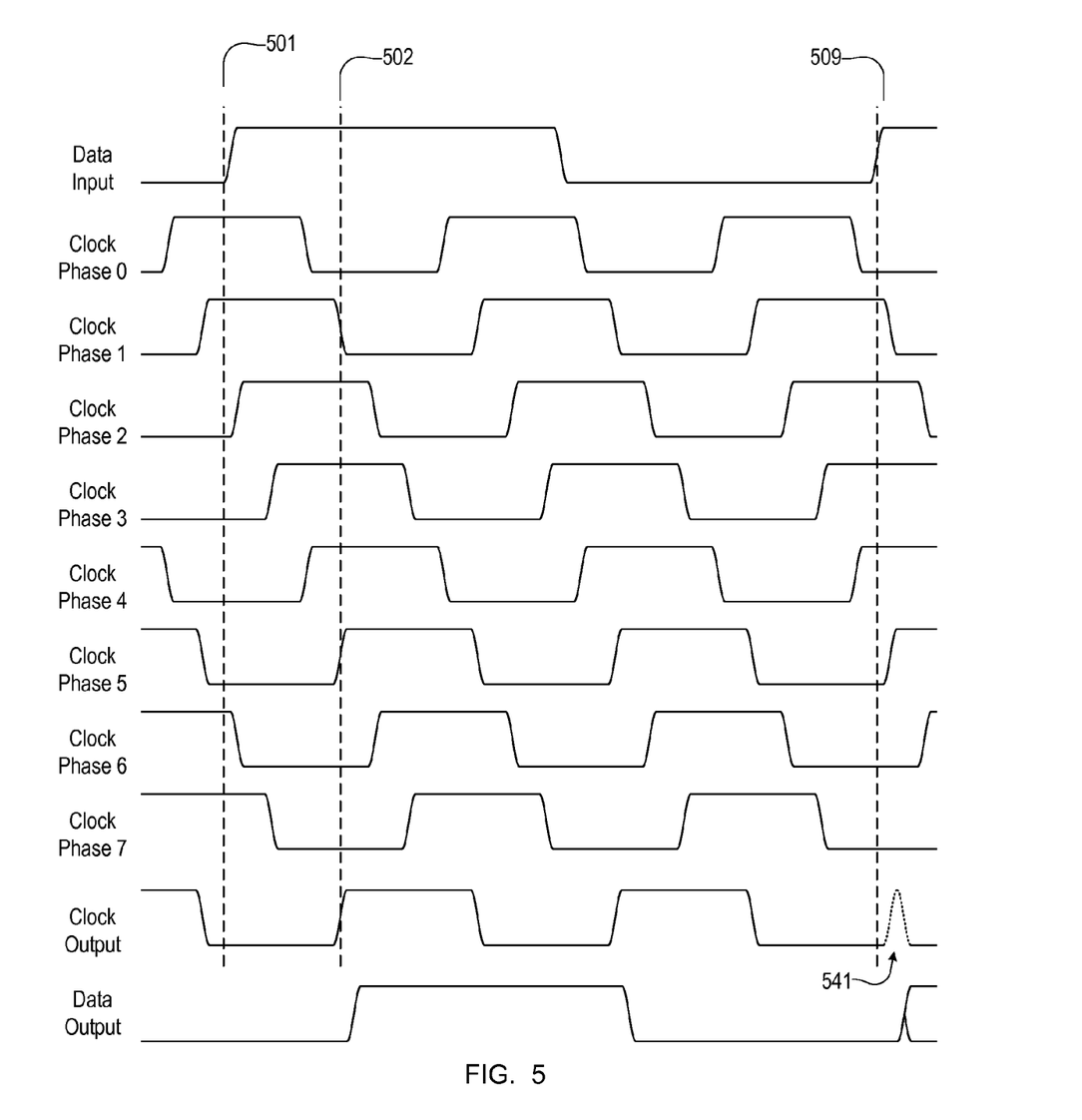
FIG. 5 is a waveform diagram illustrating operation of the clock and data recovery circuit of FIG. 4.

FIG. 5 is a waveform diagram illustrating operation of the CDR of FIG. 4 in a condition that can cause a glitch on the clock output signal in the absence of the clock glitch suppression module 490. Many other similar conditions may also exist.

At time 501, the data input signal rises and the clock phase signals are sampled in the phase sampler module 220. The phase sampler module 220 will determine that, at time 501, Clock Phases 0, 1, 6, and 7 were high and that Clock Phases 2, 3, 4, and 5 were low. The phase adjust module 260 can evaluate the values of the sampled clock phase signals and determine that the edge of the data input signal occurred between the rising edge of Clock Phase 1 and the rising edge of Clock Phase 2 (e.g., based on Clock Phase 1 being high and Clock Phase 2 being low). Based on this, the phase adjust module 260 in combination with the phase select module 280 can select phase 5 to produce the clock output signal. Accordingly, at time 502, the clock output signal rises (based on Clock Phase 5) and the data sampler module 210 samples the data input signal on the rising edge of the clock output signal. At time 502, the data input signal is high and thus the CDR produces the data output signal as a high.

At time 509, the data input signal rises and the clock phase signals are sampled in the phase sampler module 220. The phase sampler module 220 will determine that, at time 590, Clock Phases 1, 2, 3, and 4 were high and that Clock Phases 5, 6, 7, and 0 were low. The phase adjust module 260 can evaluate the values of the sampled phase signals and determine that the edge of the data input signal occurred between the rising edge of Clock Phase 4 and the rising edge of Clock Phase 5. From time 501 to time 509, the timing of the data input signal has shifted relative to the clock phase signals. Based on the new values of the sampled phase signals, the phase adjust module 260 can select phase 0 to use as the clock output signal.

However, Clock Phase 5 can occur before the phase adjust module 260 and the phase select module 280 have switched from using phase 5 to using phase 0. This can result in a glitch 541 on the clock output signal. The clock output signal transitions to a high level based on Clock Phase 5 and then transitions back to a low level based on the new phase selection of phase 0. This glitch on the clock output signal can cause erroneous operation of circuits that use the clock output signal.

The clock glitch suppression module 490 of the CDR of FIG. 4 operates to suppress glitches on the clock output signal. In an embodiment, the clock glitch suppression module 490 uses a low-going pulse that occurs after transitions on the data input signal to suppress the Clock Output signal. For example, a low-going pulse signal generated by edges of the data input signal may be logically ANDed with the clock signal from the phase select module 280. That is, the clock glitch suppression module may suppress the clock output signal for a time interval after edges of the data input signal. The duration of the pulses may, for example, be set to a duration that is longer than switching delays of the phase sampler module 220 and the phase adjust module 260.

Figure 6:
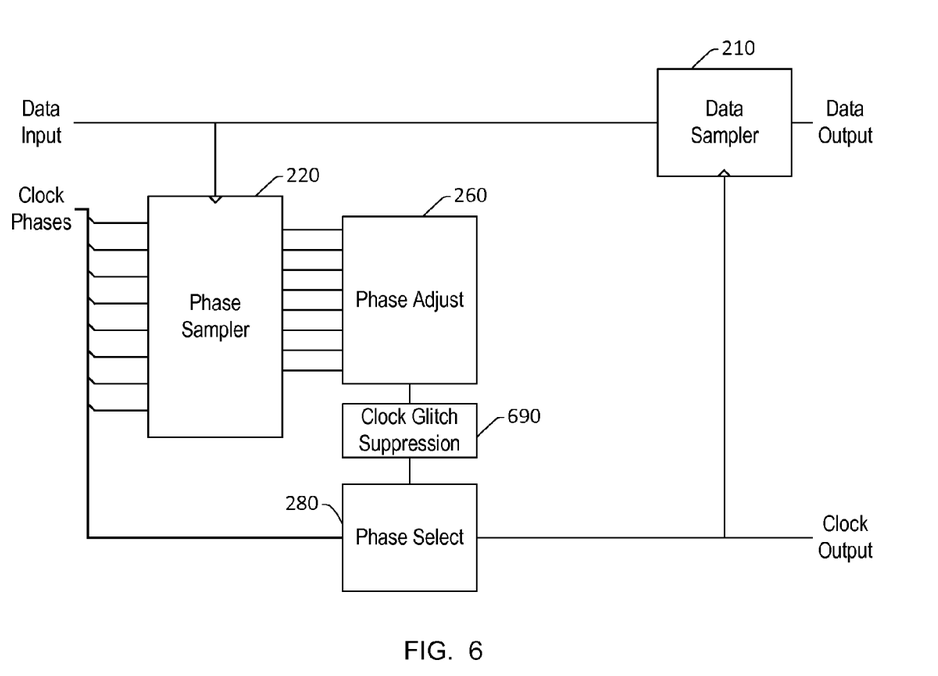
FIG. 6 is a functional block diagram of another clock and data recovery circuit according to a presently disclosed embodiment.

FIG. 6 is a functional block diagram of another clock and data recovery circuit (CDR) according to a presently disclosed embodiment. The CDR of FIG. 6 is similar to the CDR of FIG. 4 with like referenced elements operating in like fashion except for described differences. The CDR of FIG. 6 includes a clock glitch suppression module 690. The clock glitch suppression module 690 is coupled between the phase adjust module 260 and the phase select module 280. The clock glitch suppression module 690 may prevent glitches in the clock output signal by preventing large changes in the selected phase. For example, the clock glitch suppression module 690 may allow the selected phase to change by only one phase per bit time or per update. Other techniques may also be used for glitch suppression.

Figure 7:
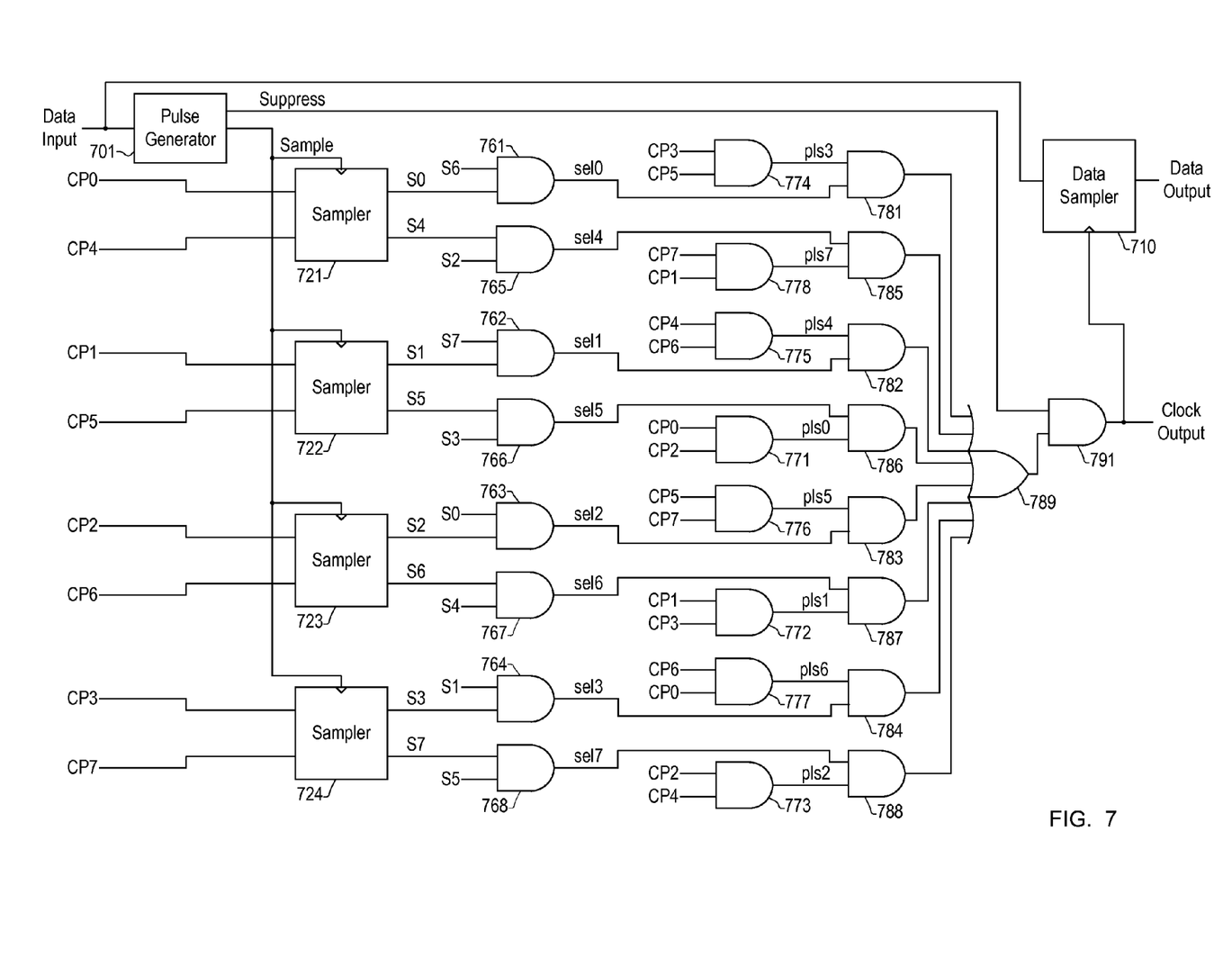
FIG. 7 is a schematic diagram of another clock and data recovery circuit according to a presently disclosed embodiment.

FIG. 7 is a schematic diagram of another clock and data recovery circuit according to a presently disclosed embodiment. The clock and data recovery circuit of FIG. 7 may be, for example, an implementation of the clock and data recovery circuit of FIG. 4. The clock and data recovery circuit of FIG. 7 receives a data input signal (Data Signal) and eight clock phase signals (CP0-7) and produces a data output signal (Data Output) and a clock output signal (Clock Output). The clock phase signals are logically combined, in the embodiment of FIG. 7, to produce the clock output signal having a duration of three clock phases.

The clock and data recovery circuit of FIG. 7 includes pulse generator module 701. The pulse generator module 701 receives the data input signal and produces a glitch suppression pulse signal (Suppress) and a sample pulse signal (Sample). The glitch suppression pulse signal and the sample pulse signal occur after edges of the data input signal. The pulse signals may occur after rising edges, falling edges or both edges of the data input signal. The duration of the pulse signals is according to their functions as described further below.

Four phase samplers 721-724 sample the clock phase signals on rising edges of the sample pulse signal to produce sampled values of the clock phase signals. Accordingly, the duration of the sample pulse signal may be chosen according to the timing requirements of the phase samplers.

Each of the phase samplers 721-724 samples a complementary (or differential) pair of the clock phase signals and produces complementary outputs that signal the sampled values of the clock phase signals. The first phase sampler 721 samples the first clock phase signal (CP0) and the fifth clock phase signal (CP4) and produces a first sampled value S0 and a fifth sampled value S4; the second phase sampler 722 samples the second clock phase signal (CP1) and the sixth clock phase signal (CP5) and produces a second sampled value S1 and a sixth sampled value S5; the third phase sampler 723 samples the third clock phase signal (CP2) and the seventh clock phase signal (CP6) and produces a third sampled value S2 and a seventh sampled value S6; and the fourth phase sampler 724 samples the fourth clock phase signal (CP3) and the eighth clock phase signal (CP7) and produces a fourth sampled value S3 and a eighth sampled value S7 Each of the phase samplers may be, for example, a sense amplifier based flip-flop.

The sampled values of the clock phase signals are logically combined to produce phase selection signals. AND gate 761 produces a first phase selection signal (sel0) by logically ANDing sampled value S0 and sampled value S6; AND gate 762 produces a second phase selection signal (sel1) by logically ANDing sampled value S1 and sampled value S7; AND gate 763 produces a third phase selection signal (sel2) by logically ANDing sampled value S2 and sampled value S0; AND gate 764 produces a fourth phase selection signal (sel3) by logically ANDing sampled value S3 and sampled value S1; AND gate 765 produces a fifth phase selection signal (sel4) by logically ANDing sampled value S4 and sampled value S2; AND gate 766 produces a sixth phase selection signal (sel5) by logically ANDing sampled value S5 and sampled value S3; AND gate 767 produces a seventh phase selection signal (sel6) by logically ANDing sampled value S6 and sampled value S4; and AND gate 768 produces a eighth phase selection signal (sel7) by logically ANDing sampled value S7 and sampled value S5.

The clock phase signals are logically combined to produce clock pulse signals. AND gate 771 produces a first clock pulse signal (pls0) by logically ANDing clock phase CP0 and clock phase CP2; AND gate 772 produces a second clock pulse signal (pls1) by logically ANDing clock phase CP1 and clock phase CP3; AND gate 773 produces a third clock pulse signal (pls2) by logically ANDing clock phase CP2 and clock phase CP4; AND gate 774 produces a fourth clock pulse signal (pls3) by logically ANDing clock phase CP3 and clock phase CP5; AND gate 775 produces a fifth clock pulse signal (pls4) by logically ANDing clock phase CP4 and clock phase CP6; AND gate 776 produces a sixth clock pulse signal (pls5) by logically ANDing clock phase CP5 and clock phase CP7; AND gate 777 produces a seventh clock pulse signal (pls6) by logically ANDing clock phase CP6 and clock phase CP0; and AND gate 778 produces a eighth clock pulse signal (pls7) by logically ANDing clock phase CP7 and clock phase CP1.

The phase selection signals, the clock pulse signals, and the glitch suppression pulse signal are logically combined to produce the clock output signal. AND gate 781 logically ANDs phase selection sel0 and clock pulse pls3; AND gate 782 logically ANDs phase selection sel1 and clock pulse pls4; AND gate 783 logically ANDs phase selection sel2 and clock pulse pls5; AND gate 784 logically ANDs phase selection sel3 and clock pulse pls6; AND gate 785 logically ANDs phase selection sel4 and clock pulse pls7; AND gate 786 logically ANDs phase selection sel5 and clock pulse pls0; AND gate 787 logically ANDs phase selection sel6 and clock pulse pls1; and AND gate 788 logically ANDs phase selection sel7 and clock pulse pls2. OR gate 789 logically ORs the outputs of AND gates 781-788.

The output of OR gate 789 is a clock output with the desired timing but may have glitches in some jitter conditions. AND gate 791 logically ANDs the output of OR gate 789 with the glitch suppression pulse signal to produce the clock output signal. The glitch suppression pulse signal is low at times when glitches may occur on the output of OR gate 789. Accordingly, the glitches on the output of OR gate 789 are suppressed on the clock output signal. The glitches may occur due to propagation delays in circuitry producing the phase selection signals (e.g., the phase samplers 721-724 and AND gates 761-768). Accordingly, the duration of the glitch suppression pulse signal may be chosen based on to the associated propagation delays.

AND gate 791 and the circuitry of the pulse generator module 701 that generates the glitch suppression pulse signal may be considered to be a glitch suppression function. AND gates 781-788 and OR gate 789 may be considered to be a phase select module. AND gates 761-768 may be considered to be a phase adjust module with AND gates 761-768 providing evaluation of the sampled values of the clock phase signals to determine the last of the clock phase signals to rise before the edges of the data input signal and the connections between AND gates 761-768 and AND gates 781-788 providing an offset from the last of the clock phase signals to rise after the edges of the data input signal.

A data sampler module 710 samples values of the data input signal on rising edges of the clock output signal.

The CDR of FIG. 7 can be implemented in many different ways. In an embodiment, the CDR is implemented in a CMOS integrated circuit. The CDR illustrated in FIG. 7 should be interpreted as a functional representation. The CDR may, for example, be implemented with other logic. Additionally, the buffer may be included on various signal paths.

Figure 8:
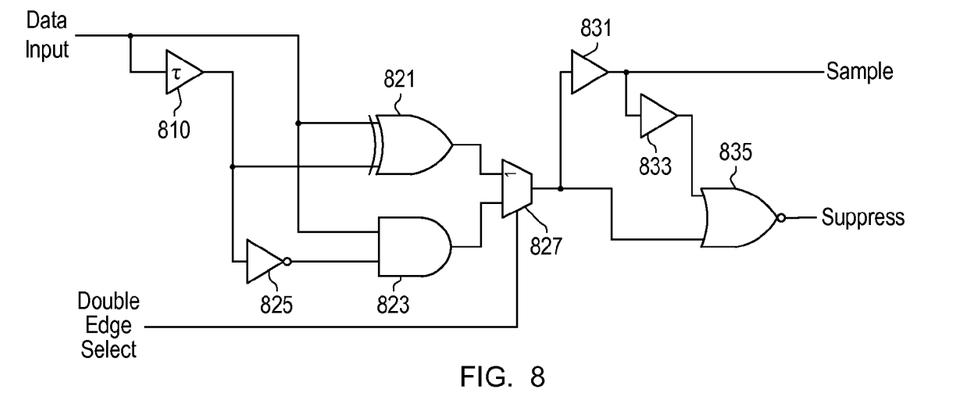
FIG. 8 is a schematic diagram of a pulse generator module according to a presently disclosed embodiment.

FIG. 8 is a schematic diagram of a pulse generator module according to a presently disclosed embodiment. The pulse generator module may be used as the pulse generator module 701 in the clock and data recovery circuit of FIG. 7.

The pulse generator module receives a data input signal (Data Input) and produces a glitch suppression pulse signal (Suppress) and a sample pulse signal (Sample). A double-edge select control signal (Double Edge Select) controls whether the pulse signals are produced on rising edges of the data input signal or both rising and falling edges of the data input signal. A multiplexer 827 selects the output of XOR gate 821 (for double edge triggered pulses) or the output of AND gate 823 (for rising edge triggered pulses).

When the double-edge select control signal is ZERO, the pulses are produced using AND gate 823 on rising edges of the data input signal. AND gate 823 logically ANDs the data input signal and a delayed and inverted copy of the data input signal. A delay element 810 receives the data input signal and produces a delayed copy of the data input signal as its output. The delay element 810 may be implemented, for example, using a chain of inverters. Inverter 825 receives the delayed copy of the data input signal and produces the delayed and inverted copy of the data input signal.

When the double-edge select control signal is ONE, the pulses are produced using XOR gate 821 on both rising and falling edges of the data input signal. XOR gate 821 receives the data input signal and the delayed copy of the data input signal from delay element 810.

The output of the multiplexer 827 is buffered by buffer 831 to drive the sample pulse signal. Buffer 831 provides drive for the loading of circuits (e.g., the phase samplers 721-724 of FIG. 7) that receive the sample pulse signal. The duration of the sample pulse signal is approximately equal to the delay of the delay element 810. The duration may differ somewhat due to other propagation delays, for example, the propagation delay of inverter 825.

The glitch suppression pulse signal is produced by NOR gate 835. NOR gate 835 logically NORs the output of multiplexer 827 and a buffered copy of the sample pulse signal. Buffer 833 receives the sample pulse signal and produces the buffered copy. The delays of buffer 831 and buffer 833 extend the duration of the glitch suppression pulse signal beyond the duration of the sample pulse signal.

Figure 9:
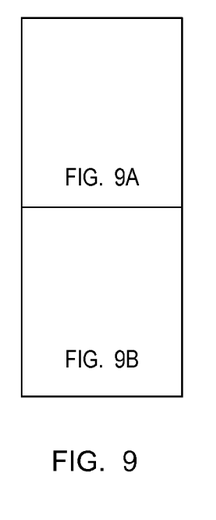
FIG. 9 is a waveform diagram illustrating operation of the clock and data recovery circuit of FIG. 7.
Figure 9A:
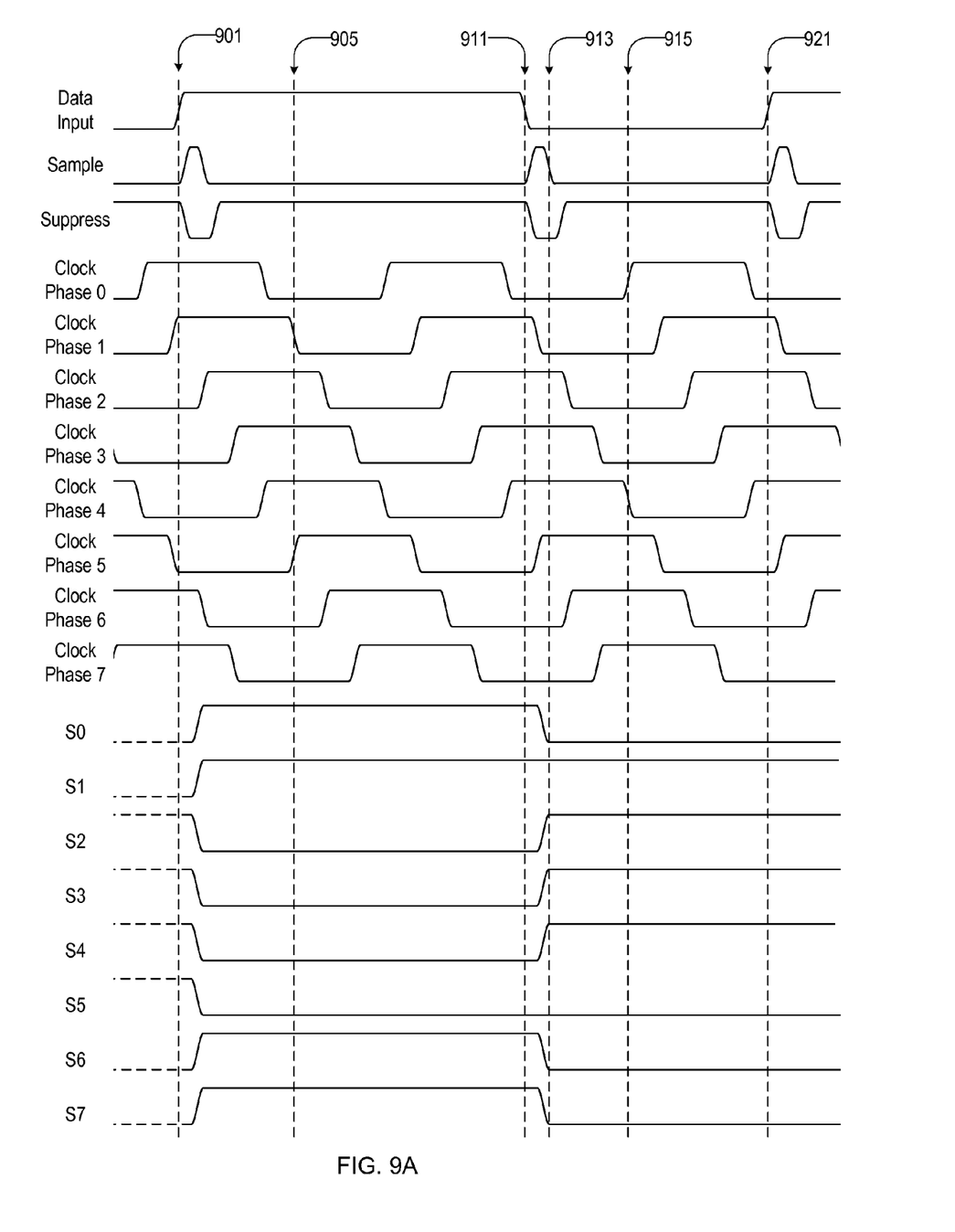
Figure 9B:
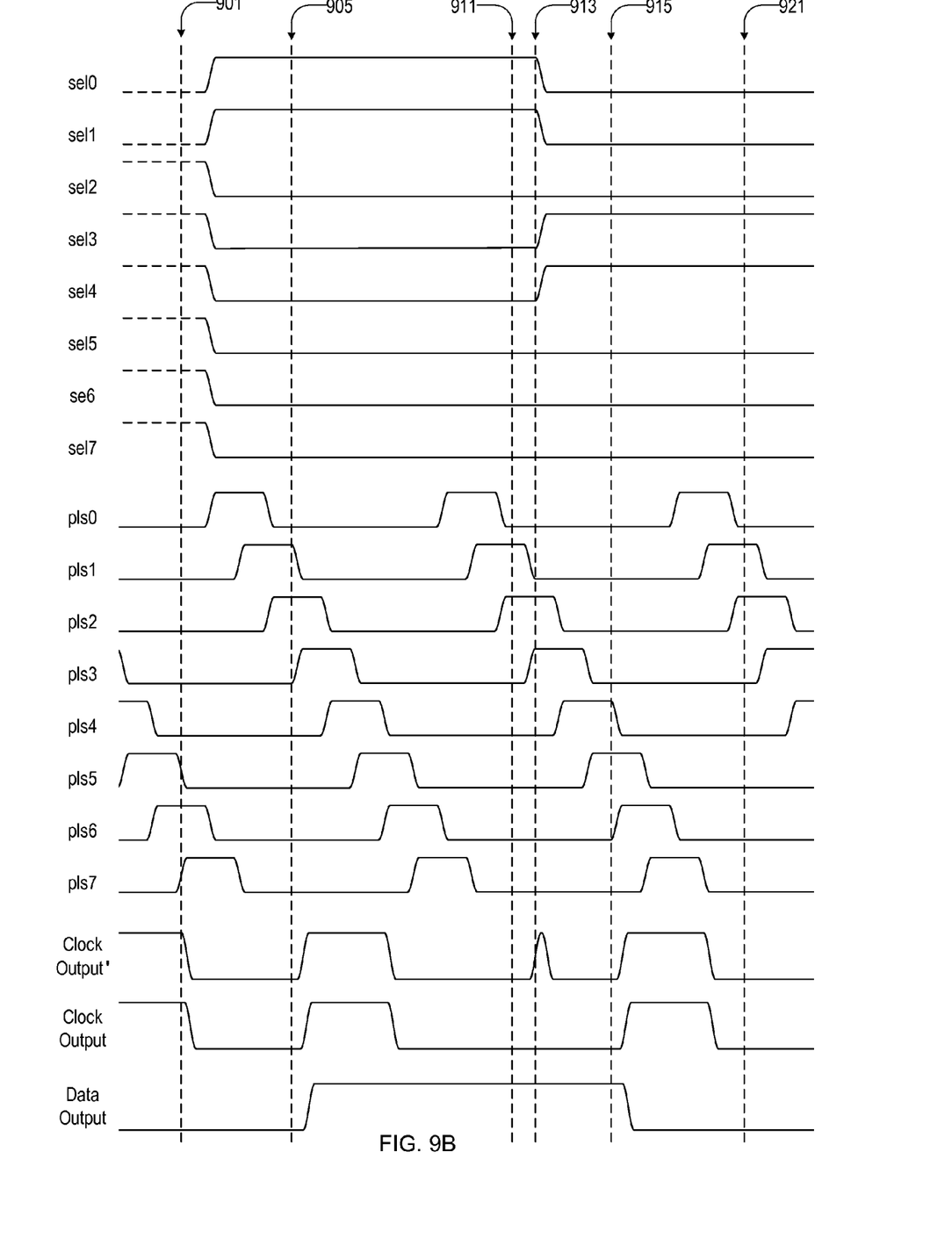

FIG. 9 is a waveform diagram illustrating operation of the clock and data recovery circuit of FIG. 7 in a condition that can cause a glitch on the clock output signal in the absence of the glitch suppression function. Many other similar conditions may also exist. The waveform diagram of FIG. 9 is also for a case where sampling the clock phase signals is triggered by both edges of the data input signal.

At time 901, the data input signal rises triggering pulses on the sample pulse signal and on the glitch suppression pulse signal. The sample pulse signal triggers the phase samplers 721-724 to sample the clock phase signals. The phase samplers 721-724 will determine that, at time 901, clock phases CP0, CP1, CP6, and CP7 were high and that clock phases CP2, CP3, CP4, and CP5 were low and the sampled values S0-S7 will be set to corresponding values.

The phase selection signals are active in pairs. The sampled clock phase signals triggered at time 901 result in AND gate 761 and AND gate 762 producing high outputs on phase selection sel0 and phase selection sel1. The other phase selection signals are low.

The clock pulse signals are produced by AND gates 771-778. The clock phase signals that are ANDed result in clock pulse signals with a duration of two phases (one-quarter clock period). For example, clock pulse pls2 is produced by AND gate 773 that logically ANDs clock pulse CP2 and clock phase CP4. Accordingly, clock pulse pls2 is active during the first half of clock phase CP2 and the first half of clock phase CP4. The other clock phase signals have corresponding timing.

AND gates 781-788 and OR gate 789 logically combine the phase selection signals and the clock pulse signals to produce a non-glitch suppressed clock output signal (Clock Output'). The phase selection triggered at time 901 does not result in a clock glitch so the clock output signal matches the non-glitch suppressed clock output signal. The high levels on phase selection sel0 and phase selection sel1 result in AND gate 781 passing clock pulse pls3 and AND gate 782 passing clock pulse pls4 which are logically ORed by OR gate 789 to produce the clock output signal that is active (beginning at time 905) during the active times of both clock pulse pls3 and clock pulse pls4. The clock output signal has duty cycle of three phases or 3/8 of the period of the clock phase signals.

Shortly after time 905, the clock output signal rises (triggered by clock phase CP5) and the data sampler module 710 samples the data input signal on the rising edge of the clock output signal. At time 905, the data input signal is high and thus the CDR produces the data output signal as a high.

At time 911, the data input signal falls triggering pulses on the sample pulse signal and on the glitch suppression pulse signal. The sample pulse signal triggers the phase samplers 721-724 to sample the clock phase signals. The phase samplers 721-724 will determine that, at time 911, clock phases CP1, CP2, CP3, and CP4 were high and that clock phases CP0, CP5, CP6, and CP7 were low. The timing relationship between the data input signal to the clock phase signals at time 911 has shifted from the timing relationship at time 901.

The sampled clock phase signals triggered at time 911 result in AND gate 764 and AND gate 765 producing high outputs on phase selection sel3 and phase selection sel4. The other phase selection signals are low.

The high levels on phase selection sel3 and phase selection sel4 result in AND gate 784 passing clock pulse pls6 and AND gate 785 passing clock pulse pls7 which are logically ORed by OR gate 789 to produce the clock output signal that is active (beginning at time 915) during the active times of both clock pulse pls6 and clock pulse pls7.

Shortly after time 915, the clock output signal rises (triggered by clock phase CP7) and the data sampler module 710 samples the data input signal on the rising edge of the clock output signal. At time 915, the data input signal is low and thus the CDR produces the data output signal as a low.

In the timing illustrated in FIG. 9, clock pulse pls3 rises before phase select sel0 switches low (following the rise of the data input signal at time 911). This triggers a glitch beginning at time 913. The glitch on the non-glitch suppressed clock output signal ends when the phase select sel0 switches low. This glitch is suppressed by AND gate 791, which logically ANDs the non-glitch suppressed clock output signal with the clock glitch suppression signal from the pulse generator module 701. The clock glitch suppression signal is low during the duration of the glitch on the non-glitch suppressed clock output signal. The clock glitch suppression signal is triggered low by the edge of the data input signal and may remain low at least until the phase selection signals have switched to their new values.

Figure 10:
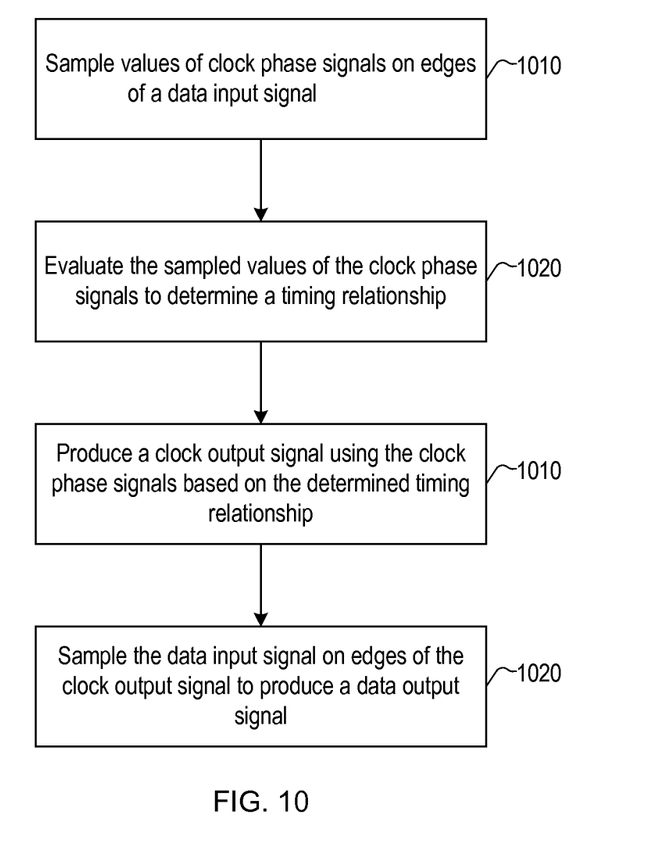
FIG. 10 is a flowchart of a process for clock and data recovery according to a presently disclosed embodiment.

FIG. 10 is a flowchart of a process for clock and data recovery according to a presently disclosed embodiment. The process may be implemented, for example, using the clock and data recovery circuit of FIG. 2, the clock and data recovery circuit of FIG. 4, or the clock and data recovery circuit of FIG. 6.

In step 1010, the process samples values of clock phase signals on edges of a data input signal. For example, the pulse generator module of FIG. 8 may be used to generate a sample pulse signal that is used by the phase samplers 721-724 of CDR of FIG. 7 to sample the clock phase signals.

In step 1020, the process evaluates the sampled values of the clock phase signals from step 1010 to determine a timing relationship between the data input signal and the clock phase signals. For example, the phase adjust module 260 of the CDR of FIG. 2 may determine the timing relationship by evaluating the sampled values of the clock phase signals to determine the last of the clock phase signals to rise before the respective edge of the data input signal.

In step 1030, the process produces a clock output signal using the clock phase signals based on the determined timing relationship between the data input signal and the clock phase signals. For example, the phase select module 280 of the CDR of FIG. 2 may produce the clock output signal having a leading-edge that is one half of the clock period after the last of the clock phase signals to rise before the respective edge of the data input signal.

In step 1040, the process samples the data input signal on edges of the clock output signal to produce a data output signal. For example, the process may use the data sampler module 210, which may be a sense amplifier type flip-flop, of the CDR of FIG. 2 to sample the data input signal on rising edges of the clock output signal.

The process of FIG. 10 may be modified, for example, by adding or altering steps. For example, a step to suppress glitches on the clock output signal may be added. Additionally, steps may be performed concurrently.

Although particular embodiments are described above, many variations are possible, including, for example, those with different signal polarities and different numbers of clock phases. Furthermore, functions described as be performed by one module may be moved to another module or distributed across modules. For example, the phase adjust module 260, the phase select module 280, and the clock glitch suppression module 490 of FIG. 4 may be combined. Additionally, features of the various embodiments may be combined in combinations that differ from those described above.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A circuit for recovering clock and data from a serial data input signal using clock phase signals, the data input signal containing a serial stream of data, the clock phase signals oscillating at a frequency that approximately matches a data rate of the data input signal, and the clock phase signals equally spaced in phase, the circuit comprising:
   a phase sampler configured to sample values of clock phase signals on edges of a data input signal;
   a phase adjuster configured to evaluate the sampled values of the clock phase signals to determine the last of the clock phase signals to rise before a respective edge of the data input signal and determine a timing relationship between the data input signal and the clock phase signals utilizing the last of the clock phase signals to rise before the respective edge of the data input signal;
   a phase selector configured to produce a clock output signal using the clock phase signals based on the timing relationship between the data input signal and the clock phase signals determined by the phase adjuster; and
   a data sampler configured to produce a data output signal by sampling the data input signal on edges of the clock output signal.

2. The circuit of claim 1, wherein the phase selector is further configured to produce the clock output signal to have a leading edge with a predetermined offset from the last of the clock phase signals to rise before the respective edge of the data input signal.

3. The circuit of claim 2, wherein the predetermined offset equals one-half of a period of the clock phase signals.

4. The circuit of claim 1, further comprising a glitch suppression module configured to suppress glitches on the clock output signal.

5. The circuit of claim 4, wherein the glitch suppression module suppresses the clock output signal for a time interval after edges of the data input signal.

6. The circuit of claim 1, wherein the number of clock phase signals is eight.

7. The circuit of claim 6, wherein the clock output signal has a duty cycle of $3/8$ of a period of the clock phase signals.

8. The circuit of claim 1, wherein the phase sampler is configured to sample the values of the clock phase signals on rising and falling edges of the data input signal.

9. The circuit of claim 1, further comprising a pulse generator module configured to generate a sample pulse signal on edges of the data input signal, and wherein the phase sampler is configured to sample the values of the clock phase signals triggered by the sample pulse signal.

10. The circuit of claim 9, wherein the pulse generator module is further configured to generate a glitch suppression pulse signal, and the clock and data recovery circuit further comprises a glitch suppression module configured to suppress glitches on the clock output signal using the glitch suppression pulse signal.

11. A method for recovering clock and data from a data input signal, the method comprising:
sampling values of clock phase signals on edges of the data input signal;
evaluating the sampled values of the clock phase signals to determine the last of the clock phase signals to rise before a respective edge of the data input signal;
determining a timing relationship between the data input signal and the clock phase signals utilizing the last of the clock phase signals to rise before the respective edge of the data input signal;
producing a clock output signal using the clock phase signals based on the determined timing relationship between the data input signal and the clock phase signals; and
sampling the data input signal on edges of the clock output signal to produce a data output signal.

12. The method of claim 11, wherein producing the clock output signal comprises producing the clock output signal to have a leading edge with a predetermined offset from the last of the clock phase signals to rise before the respective edge of the data input signal.

13. The method of claim 12, wherein the predetermined offset equals one-half of a period of the clock phase signals.

14. The method of claim 11, further comprising suppressing glitches on the clock output signal.

15. The method of claim 14, wherein suppressing glitches comprises suppressing the clock output signal for a time interval after edges of the data input signal.

16. The method of claim 11, wherein the values of the clock phase signals are sampled on rising and falling edges of the data input signal.

17. The method of claim 11, further comprising generating a sample pulse signal on edges of the data input signal, and wherein sampling the values of the clock phase signals uses the sample pulse signal.

18. The method of claim 17, further comprising:
generating a glitch suppression pulse signal; and
suppressing glitches on the clock output signal using the glitch suppression pulse signal.

19. An apparatus for recovering clock and data from a data input signal, the apparatus including:
a means for sampling values of clock phase signals on edges of the data input signal;
a means for evaluating the sampled values of the clock phase signals to determine the last of the clock phase signals to rise before a respective edge of the data input signal and determine a timing relationship between the data input signal and the clock phase signals utilizing the last of the clock phase signals to rise before the respective edge of the data input signal;
a means for producing a clock output signal using the clock phase signals based on the determined timing relationship between the data input signal and the clock phase signals; and
a means for sampling the data input signal on edges of the clock output signal to produce a data output signal.

20. The apparatus of claim 19, wherein the means for producing the clock output signal is produces the clock output signal to have a leading edge with a predetermined offset from the last of the clock phase signals to rise before the respective edge of the data input signal.

21. The apparatus of claim 20, wherein the predetermined offset equals one-half of a period of the clock phase signals.

22. The apparatus of claim 19, further comprising a means for suppressing glitches on the clock output signal.

23. The apparatus of claim 22, wherein the means for suppressing glitches suppresses the clock output signal for a time interval after edges of the data input signal.

24. The apparatus of claim 19, wherein the means for sampling samples the values of the clock phase signals on rising and falling edges of the data input signal.

25. The apparatus of claim 19, further comprising a pulse generator module configured to generate a sample pulse signal on edges of the data input signal, and wherein the means for sampling samples the values of the clock phase signals triggered by the sample pulse signal.

26. The apparatus of claim 25, wherein the pulse generator module is further configured to generate a glitch suppression pulse signal, and the apparatus further comprises a means for suppressing glitches on the clock output signal using the glitch suppression pulse signal.

* * * * *